United States Patent [19]
Lamourelle

[11] Patent Number: 6,130,383
[45] Date of Patent: *Oct. 10, 2000

[54] SOLDER BALL ARRAY PACKAGE AND A METHOD OF ENCAPSULATION

[75] Inventor: François Lamourelle, Grenoble, France

[73] Assignee: SGS-Thomson Microelectronics, S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/654,819

[22] Filed: May 24, 1996

Related U.S. Application Data
[60] Provisional application No. 60/007,759, Nov. 30, 1995.

[30] Foreign Application Priority Data

May 31, 1995 [FR] France ................................. 95 06497

[51] Int. Cl.⁷ .................................................. H01L 23/02
[52] U.S. Cl. ...................... 174/52.4; 174/52.2; 257/787; 264/272.17
[58] Field of Search ................... 174/52.1, 52.2, 174/52.3, 52.4; 361/748, 749, 760, 761; 264/272.17, 279.1, 276; 29/827, 841; 437/211, 219, 214, 210; 425/127, 129.1, 183; 257/667, 668, 670, 671, 701, 702, 666, 787, 786, 780, 788; 438/124, 127, 977

[56] References Cited

U.S. PATENT DOCUMENTS

| | | | |
|---|---|---|---|
| 5,218,759 | 6/1993 | Juskey et al. | 29/840 |
| 5,241,133 | 8/1993 | Mullen et al. | 174/52.4 |
| 5,635,671 | 6/1997 | Freyman et al. | 174/52.2 |

FOREIGN PATENT DOCUMENTS 2628263  9/1989  France .

OTHER PUBLICATIONS

Patent Abstracts of Japan, vol. 014 No. 365 (E–0961), Aug. 8, 1990, and JP–A–02 129933 (Mitsubishi Electric Corp.) May 18, 1990.

Patent Abstracts of Japan, vol. 007, No. 072 (E–166), Mar. 25, 1983, and JP–A–28 000159 (Nippon Denki KK) Jan. 5, 1983.

Patent Abstracts of Japan, vol. 016, No. 486 (E–1276), Oct. 8, 1992, and JP–A–04 177753 (Citizen Watch Co. Ltd.) Jun. 24, 1992.

Patent Abstracts of Japan, vol. 017, No. 687 (E–1478), Dec. 16, 1993, and JP–A–05 235069 (Matsushita Electric Ind. Co. Ltd.) Sep. 10, 1993.

*Primary Examiner*—Kristine Kincaid
*Assistant Examiner*—Hung V Ngo
*Attorney, Agent, or Firm*—Theodore E. Galanthay; Allen, Dyer, Doppelt, Milbrath & Gilchrist, P.A.

[57] ABSTRACT

A solder ball array package has a mould gate tape that is attached on top of a portion of the top surface of a leadless circuit carrying insulating substrate and on top of a portion of the top metallization pattern. The mould gate tape, which is optionally removable after completion of the moulding process, is such that it does not interfere with the design of the top side metallization pattern.

8 Claims, 8 Drawing Sheets

SOLDER BALL ARRAY PACKAGE AND A METHOD OF ENCAPSULATION

CROSS REFERENCE TO RELATED APPLICATIONS

This application claims priority from U.S. Provisional No. 60/007,759, filed Nov. 30, 1995, and French App'n 95-06497, filed May 31, 1995.

The present invention relates to packaging for semiconductor devices, and more particularly to leadless pad array packaging.

A leadless pad array chip carrier package is described in U.S. Pat. No. 5,241,133 Mullen, III et al. and a method of making a leadless pad array chip carrier package by transfer moulding is described in U.S. Pat. No. 5,218,759 Juskey et al. Both patents are hereby incorporated by reference.

Leadless pad array chip carrier packages, also commonly known as ball grid array (BGA) packages, have been introduced and developed over recent years. These leadless pad array chip carrier packages have become popular primarily due to their high connection densities, low profiles and low costs.

However, one problem associated with the transfer moulding of these packages is that it generally requires several labor intensive manufacturing steps that limit, amongst other aspects, the productivity rate of a manufacturing line. Other problems arise that are related to the metallization patterns of the insulating substrate.

The problem of labor intensive manufacturing occurs when the transfer moulding is carried out by plate moulding, which typically requires three plates. Plate moulding typically includes the steps of:

loading, by means of an operator, the bottom plate and a plurality of packages to be moulded, or encapsulated;

loading, by means of an operator, an intermediate plate, which has suitable openings, and manually adjusting the intermediate plate;

loading, by means of an operator, a top plate onto the intermediate plate so as to clamp the packages and create suitable cavities into which the moulding material is introduced;

introducing the moulding material;

unloading, by means of an operator, the top plate from the intermediate plate;

unloading, by means of an operator, the intermediate plate;

unloading, by means of an operator, the bottom plate and the plurality of moulded packages; and manually degating, i.e. removing, the waste plastic from the moulded packages.

The other problems, which are associated with metallization patterns, can be better understood with reference to illustrations.

Figure 1:
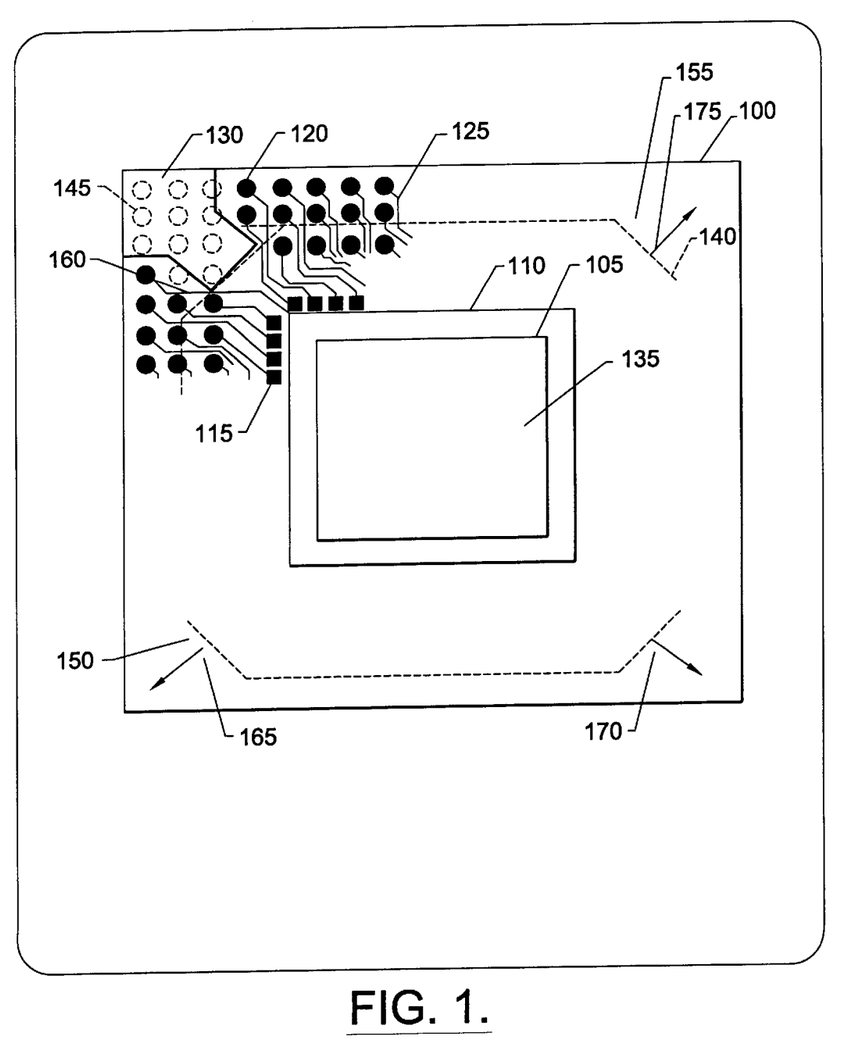
FIGS. 1 and 2 illustrates already depicted embodiments of a top down view of a leadless pad array chip carrier package of the prior art.

FIG. 1 illustrates a top down view of a leadless pad array chip carrier package. The insulating substrate 100 of the carrier package has an attached metallization pattern that includes: guard rings 105, 110; bond pads 115; via pads 120 (having associated through plated vias—not illustrated); connections 125 between the bond pads and via pads; a mould gate region 130 situated, in this particular illustration, at one of the corners of the substrate; and typically a suitably deposited solder resist mask (not illustrated). The underside of the substrate 100 (not illustrated) also has an attached metallization pattern and suitably deposited solder resist mask.

A semiconductor device (not illustrated) is mechanically mounted and attached to the center portion 135 of the substrate 100 and is electrically bonded to the bond pads 115 by aerial leads bonding its output pads to these bond pads 115.

The dotted line 140 illustrates a typical perimeter outline of a protective plastic cover that is moulded about the semiconductor device and a substantial portion of the first side of the substrate 100. The moulding is such that it reveals a portion of the top side of the substrate, i.e. the side on which the semiconductor device is mounted, about the perimeter 140 of the protective plastic cover.

It can be seen that each of the corners of the protective plastic cover are chamfered. This chamfering is preferable because it reduces the stress that would otherwise exist at these corners when the substrate is subjected to positive and negative bending and twisting forces and the different thermal expansion and contraction coefficients of the plastic material, the substrate and the semiconductor device. If the corners are not chamfered, it will happen that, under certain conditions, the protective plastic cover will become detached from the substrate 100 at one or more of the corners, which will eventually lead to failure problems. Alternatively, the corners could be rounded (not illustrated).

It is preferable that the corner associated with the mould gate region 130 (which normally takes the form of that shown) has a substantially straight interface between the gate mould region and the protective plastic cover. Of course, the mould material should always be introduced via a substantially central portion of the mould gate region and should under no circumstances be allowed to be introduced into the package other than via the mould gate region. In other words, the mould material should notably not be allowed to be introduced into the mould cavity via the solder resist mask for example, as this would cause degating problems.

Furthermore, it is preferable that at this interface, the width of the chamfer is greater than that of the gate mould region. A substantially straight interface, where the width of the chamfer is greater than that of the gate mould region, will reduce any risks of inadvertently detaching the protective plastic cover from the substrate 100 when the excess plastic that is deposited on the gate mould region is degated, i.e. torn, from the gate mould region after completion of the moulding process.

Because of the preference of chamfering the corners and the fact that the gate mould region is situated at a chamfered corner, the area occupied by the gate mould region is relatively substantial. The area of the mould gate region is such that it requires a number of via pads 120, that would normally be situated on the substrate where the mould gate region is situated, to be redeployed to an area not covered by the mould gate region. The via pads that are to be redeployed are illustrated in FIG. 1 as twelve dashed circles 145.

The redeployment of the via pads gives rise to two problems. Firstly, these via pads have to be squeezed into a smaller area, for a substrate having a fixed area, as is normally the case. Secondly, the routing, i.e. connections 125, between the bond pads 115 and there associated vias pads 120 becomes more difficult, due to the imposed area restriction because of the redeployment of the via pads.

Furthermore, these two problems are aggravated when there is a need for higher input/output connection densities, especially when the area of the substrate 100 remains the same, or possibly has to be reduced.

Also, the redeployment of the via pads and the tighter routing between the bond pads and there associated vias pads must not compromise in any way the electrical integrity of the metallization pattern: neither must it violate any design rules, i.e. the minimum distances that must be respected between connections and/or via pads etc.

It should be noted that it is essential that all of the chamfered corners: especially those corners 150, 155 adjacent to the corner 160, from where the plastic material is introduced; are completely filled, i.e. that there are no air traps.

Therefore, situated around the periphery of the cavity are small air vents 165, 170, 175 that allow the air within the cavity to escape when the plastic material is introduced into the cavity. These air vents can be placed at the chamfered corners, as illustrated, or along the sides (not illustrated), or both.

When moulding is completed, the excess plastic material that remains on the surface of the mould gate region is removed. The moulding can be carried out by either transfer moulding, injection moulding or reaction injection moulding.

The principal reason behind the placement of the mould gate region at a corner is attributed to the manner in which packages having leadframes have traditionally been moulded. These leadframe packages have traditionally been moulded either from above or below the leadframe, or both above and below. However, more recently, the moulding of leadframe packages: especially those that have large input/output connections on all sides of the package; takes place via a tie bar that is situated at one or more corners of the leadframe.

An important point to note in this example is that the adhesion of the mould gate region 130 to the substrate must be greater than the adhesion of the plastic material to the mould gate region. If this is not the case, the mould gate region will almost certainly be torn from the substrate in the attempt to tear the excess plastic from the mould gate region.

Typically, the mould gate region has a thin layer of gold, or some other suitable metal, deposited on its exposed, upper, surface; which facilitates in reducing the adhesion of the excess plastic to the mould gate region and prevents the mould gate region from oxidising.

Furthermore, the first and second metallization layers will normally have an insulating layer, for example solder resist, that is deposited over a substantial portion of the metallised layers so as to electrically isolate the surface of the metallization layers and to prevent oxidation of these metallised layers. There are some areas of the metallised layers that do not require this insulating layer and they include the mould gate region, the bonding pads and the solder ball pads (not illustrated).

Figure 2:
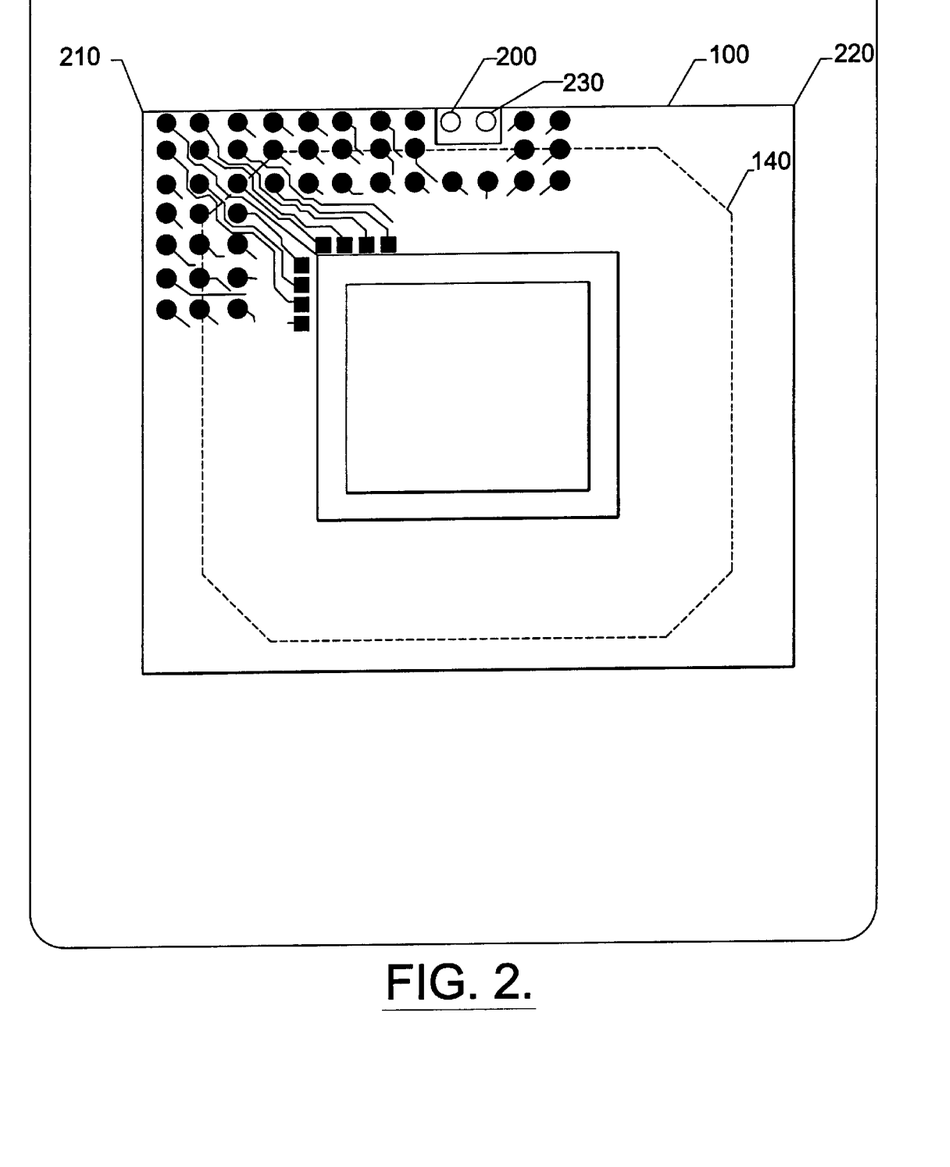
Figure 2A:
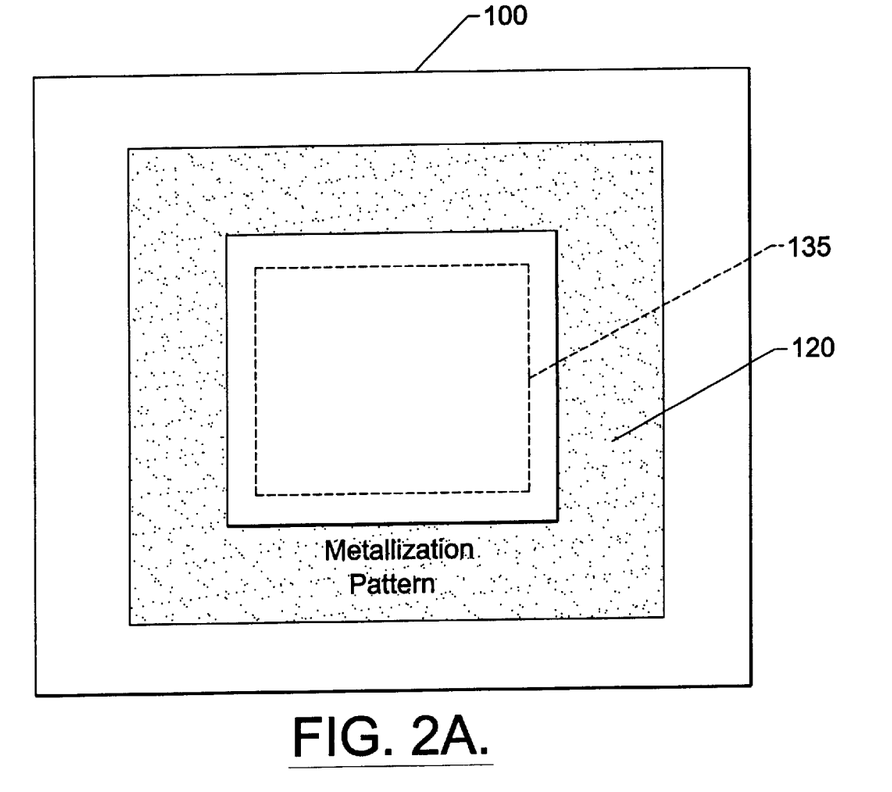
FIG. 2A illustrates the second side of the substrate showing a second metallization pattern, connected by vias 120 to bond tabs and via tabs as in the first metallization pattern.

FIG. 2 illustrates a top down view of a leadless pad array chip carrier package that is of a same type as that of FIG. 1 but which is different in that it has a mould gate region that is situated away from the corners of the package.

Referring to FIG. 2, the mould gate metallised region 200 is illustrated as being centered about the length of the substrate 100, i.e. the mould gate region is equidistant between two adjacent corners 210 and 220. Alternatively, the mould gate region could be placed anywhere between two adjacent corners.

It can be seen that the area occupied by this mould gate region 200 is somewhat less than that which is occupied by the mould gate region 130 of FIG. 1. Nevertheless, a number of via pads 230, at their associated connections, still have to be redeployed: and even more redeployment would be required if there were more than one of these types of mould gate regions incorporated with the top metallization pattern.

An object of the present invention is to provide a leadless pad array chip carrier package that has a mould gate region that does not neutralize any of the area required by the top metallization pattern.

Another object of the present invention is to provide a leadless pad array chip carrier package that has a mould gate region that does not require the redeployment of any via pads or connections.

Other objects of the present invention provide for a leadless pad array chip carrier package that has a removable mould gate region or regions; the maximum available area in which to deploy via pads; the maximum area in which to route connections between bond pads and via pads; and less wastage of the moulding material.

In order to achieve these objects and overcome the problems associated with the prior art, the present invention proposes for a leadless pad array chip carrier package whose mould gate region has no impact upon the layout of the metallization layer associated with the mould side of a solder ball array package.

According to the present invention, a solder ball array package is provided that includes a leadless circuit carrying insulating substrate having opposing planar first and second sides, a first metallization pattern, attached to the first side of the circuit carrying insulating substrate, that includes a plurality of bond pads, a plurality of via pads, and a plurality of electrical connections between the plurality of bond pads and via pads, a second metallization pattern, attached to the second side of the substrate, that includes an array of substantially coplanar surface mount solder pads, for receiving solder balls, a plurality of electrically conductive vias that penetrate through the substrate for making electrical connections between the plurality of via pads and the array of solder pads, a semiconductor device that is electrically and mechanically mounted on the first side of the substrate, a protective plastic cover moulded about the semiconductor device and a substantial portion of the first side of the substrate, the cover being such that it reveals a portion of the first side of the substrate about a perimeter of the protective plastic cover, a mould gate region realized on a portion of the first side of the substrate and wherein this mould gate region is realized by attaching a tape on a portion of the first metallization pattern.

According to certain embodiments of the invention, the attached tape remains permanently attached or can be removed. It can be attached by means of an adhesive.

According to other embodiments of the invention, the mould gate region can comprise polyimide tape, metallic foil, a silicone based material, or polytetrafluoroethylene. The foil mould gate regions are electrically isolated from the first metallization pattern.

According to another embodiment of the present invention, the mould gate region can be attached to a substantial portion of the first side of the substrate, for example, right about a perimeter of the protective plastic cover.

According to other embodiments of the present invention, one or more mould gate regions can be situated at one, or several, of the corners of the substrate and/or can be situated between the corners of the substrate.

According to other embodiments of the present invention, the mould gate region or regions can be situated away from any corner of the substrate by at least the width of the revealed portion of the first side of the substrate about the perimeter of the protective plastic cover. The mould gate regions can be situated such that they are equidistant between corners of the substrate.

According to another embodiment of the present invention, a method of making a solder ball array package is disclosed that includes the steps of, providing a leadless circuit carrying insulating substrate, realizing a first metallization pattern, attached to the first side of the substrate, that includes a plurality of bond pads, a plurality of via pads, a plurality of electrical connections between the plurality of bond pads and via pads, realizing a second metallization pattern, attached to the second side of the substrate, that includes an array of substantially coplanar surface mount solder pads, for receiving solder balls, realizing a plurality of electrically conductive vias that penetrate through the substrate for making electrical connections between the plurality of via pads and the array of solder pads, mounting a semiconductor device that is electrically and mechanically on the first side of the substrate, wherein, this method includes the steps of, attaching a tape on a portion of the first side of the substrate at the place of a portion of the first metallization pattern, for serving as a moulding injection region.

moulding, via the moulding injection region, a protective plastic cover about the semiconductor device and a substantial portion of the first side of a substrate, the moulding being such that it reveals a portion of the first side of the circuit carrying substrate about a perimeter of the protective plastic cover; and removing the excess plastic from the surface of the moulding injection region after the moulding of the protective plastic cover is completed.

According to another embodiment of the present invention, a method of making a solder ball array package is disclosed that includes the step of removing the moulding injection tape.

According to other embodiments of the present invention, the step of moulding is carried out by a technique of transfer moulding, injection moulding, or reaction moulding.

According to other embodiments of the present invention, a plurality of solder ball array packages are moulded at the same time and the moulding process is fully automated.

These objects as well as other features and advantages of the present invention will be exposed in detail in the following description of the particular embodiments that are intended to be non-limiting with relation to the attached figures amongst which:

DETAILED DESCRIPTION

Although this invention will be described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

Figure 3:
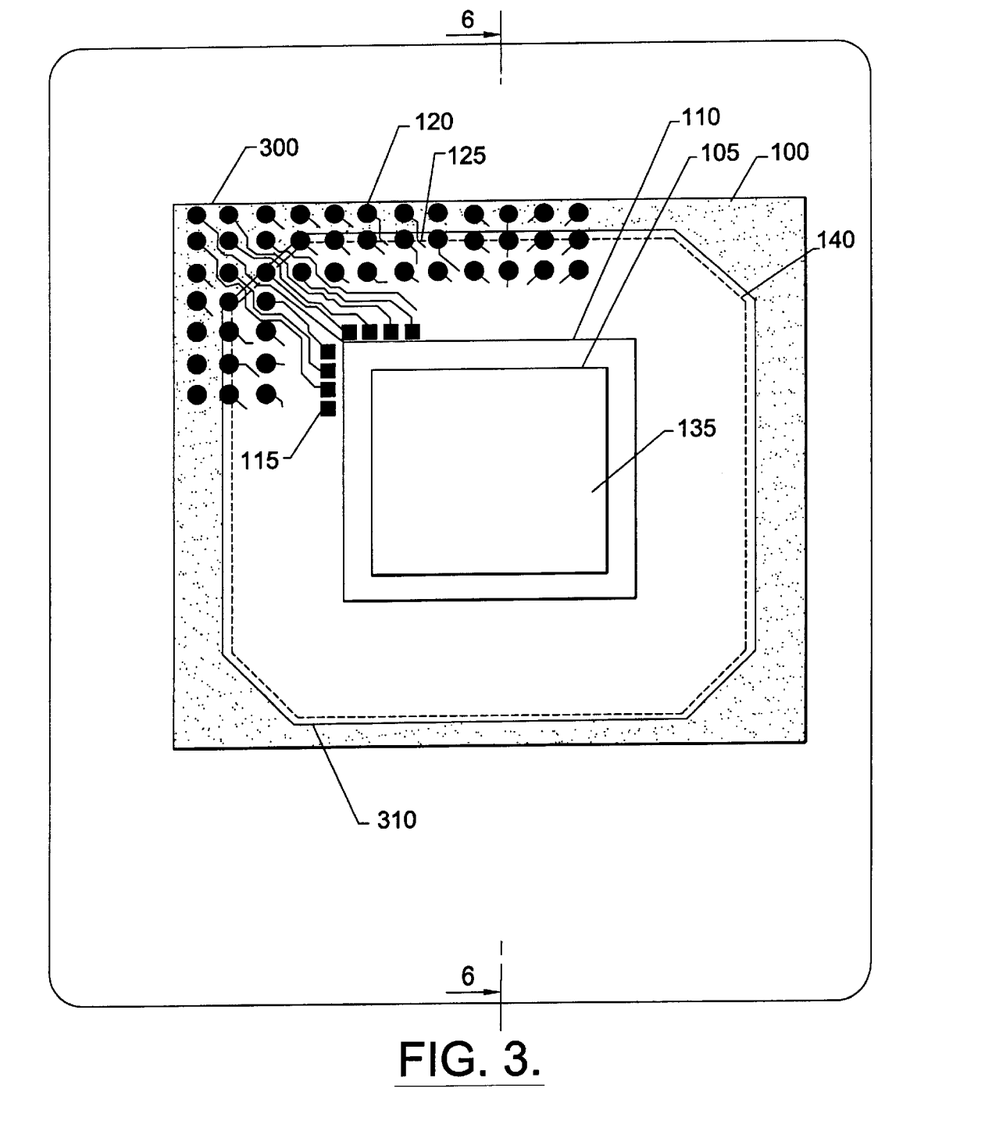
FIG. 3 illustrates an embodiment of a top down view of a chip carrier package having a mould gate region according to the present invention.

Referring to FIG. 3, the present invention proposes to provide a mould gate tape that is attached on top of a portion of the first side of the substrate and particularly on top of a portion of the first metallization pattern.

Although not illustrated, the first, and indeed the second, metallization layer will normally have an insulating layer, for example solder resist (not illustrated here), that is deposited over a substantial portion of the metallised layer so as to electrically isolate the surface of the metallization layer and prevent oxidation. There are some areas of the metallised layers that do not require the insulating layer. They concern the bonding pads and the solder ball pads (not illustrated).

In this particular embodiment, the mould gate tape 300 is illustrated as being attached to a substantial portion of the first side of the substrate. This mould gate tape is situated around the perimeter 140 of the protective plastic cover.

Even though, in a preferred embodiment, the inner perimeter 310 of the mould gate tape 300 is away from the perimeter 140 of the protective plastic cover, as illustrated, it could in fact extend to and even beyond this perimeter 140. The advantage of having a mould gate tape situated exterior to the periphery 140 of the protective plastic cover, is that the injection, i.e. the introduction, of the material used for moulding can take place from any desired or preferred position or positions.

This mould gate tape 300 can be attached, by means of a strong adhesive, for example, such that it remains permanently attached, even when the excess mould material is removed, by tearing for example, from this mould gate tape 300. In other words the adhesion of the adhesive used to attach the mould gate tape 300 is greater than that of the excess plastic to this mould gate tape 300.

Alternatively, this mould gate tape 300 can be temporarily attached, by means of a weak adhesive, such that it does not remain permanently attached. The mould gate region could therefore be removed at the same time as when the excess mould material is removed. In other words the adhesion of the adhesive used to attach the mould gate tape 300 would be less than that of the excess plastic to this mould gate tape 300.

The advantage of having such a mould gate tape 300, whether permanently attached or not, can easily be seen by the fact that there has been no disturbance, whatsoever, with regards the vias 120 or their connections 125 on the top (and the bottom) metallization layer.

Figure 4:
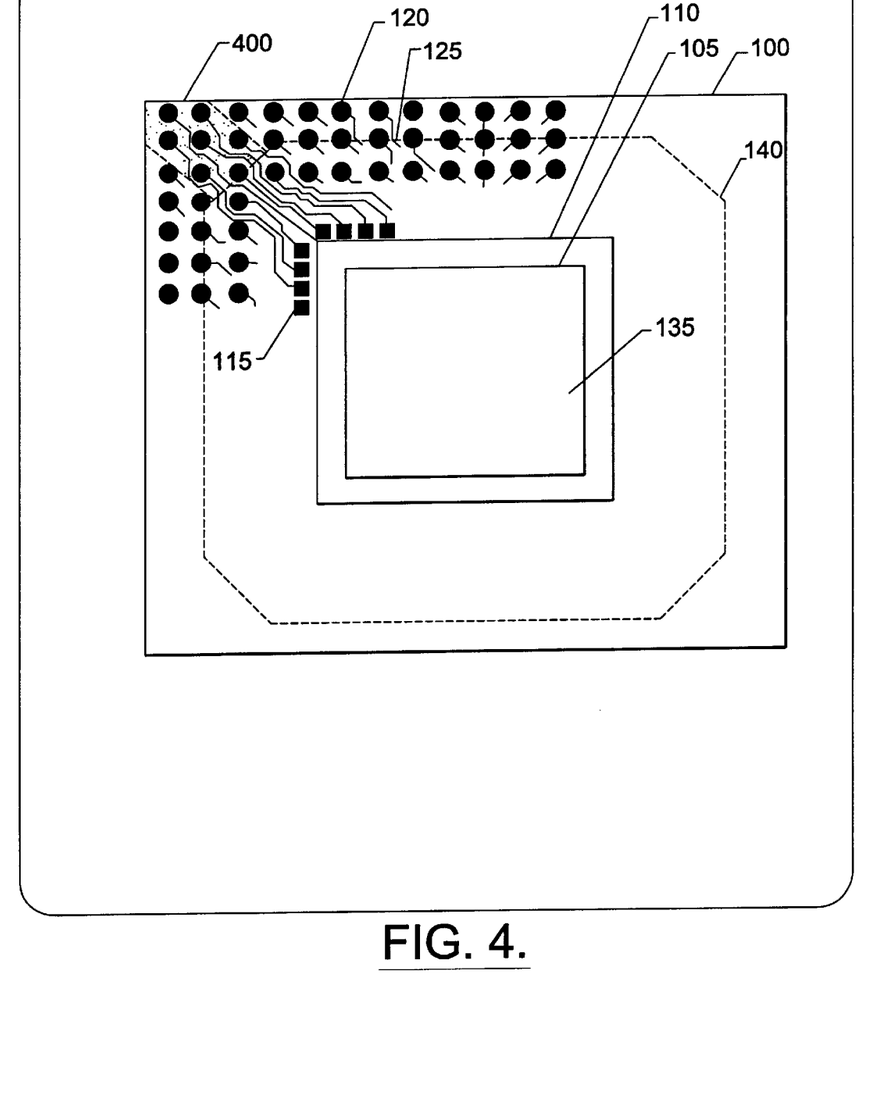
FIGS. 4 and 5 illustrate another embodiments of a top down view of a leadless pad array chip carrier package having mould gate regions according to the present invention.

FIG. 4 illustrates another embodiment of a mould gate tape according to the present invention.

This embodiment of the present invention proposes to realize a mould gate tape 400 that is attached to a portion of the first side of the substrate 100.

However in FIG. 4, the mould gate region 400 is illustrated as being attached to a smaller portion of the first side of the substrate 100.

In this embodiment, the mould gate region 400 is situated at one of the corners of the substrate 100. Again, the advantage of having such a mould gate region 400 can easily be seen by the fact that there has been no disturbance, whatsoever, with regards the vias 120 or their connections 125 on the top (and the bottom) metallization layer.

This mould gate region 400 can also be attached by means of a strong or a weak adhesive depending on whether the mould gate region is intended to remain on the substrate 100 or not: as was the case in relation to the mould gate region 300.

Even though in this example only one mould gate region has been illustrated, there would be none of the redeployment problems that would otherwise be associated with the prior art in having a plurality of such mould gate regions.

Figure 5:
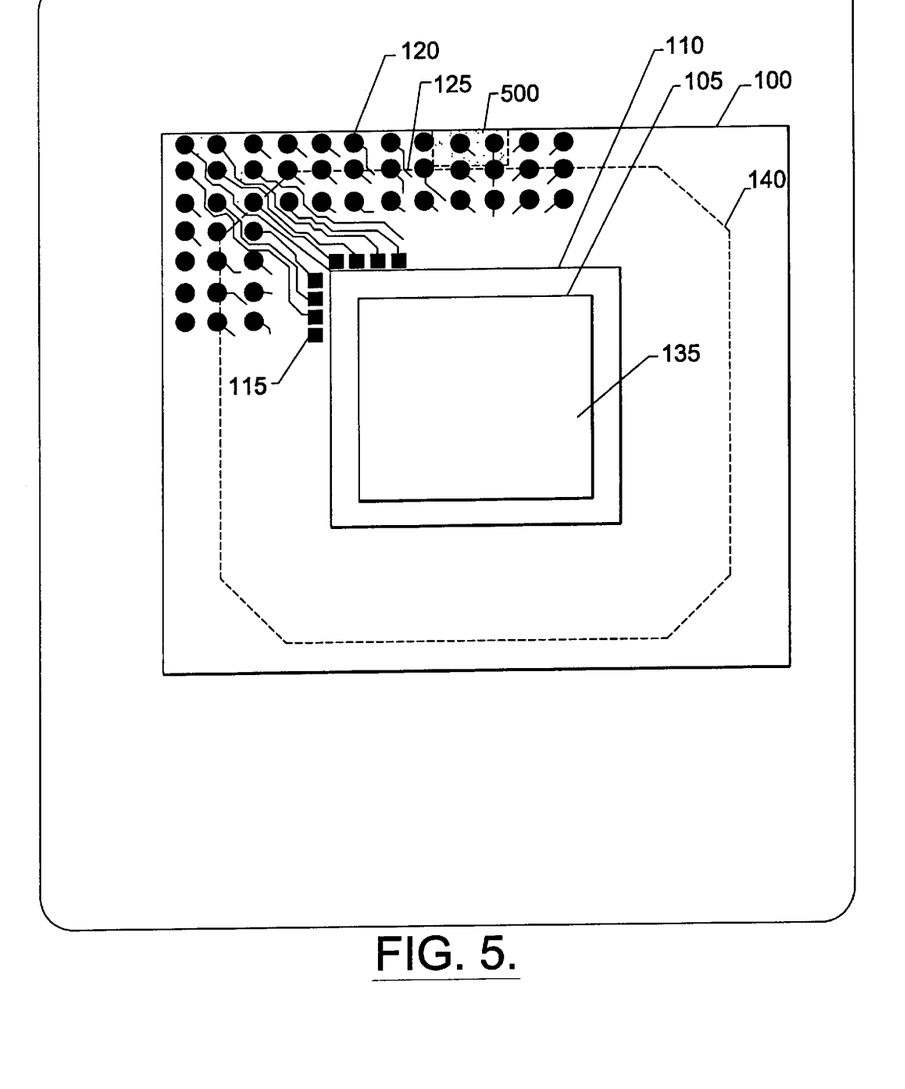

FIG. 5 illustrates another embodiment of a mould gate region according to the present invention.

This embodiment of the present invention also proposes, as was the case with regard to FIGS. 3 and 4, to provide a mould gate region 500 that is attached to a portion of the first side of the substrate.

In this particular embodiment, the mould gate region 500 is illustrated as being attached to a smaller portion of the first side of the substrate.

In this embodiment, the mould gate region 500 is centrally situated between two corners of the substrate 100. Yet again, the advantage of having such a mould gate region 500 can easily be seen by the fact that there has been no disturbance, whatsoever, with regards to the vias 120 or their connections 125 on the top (and the bottom) metallization layer.

This mould gate region 500 can also be attached by means of a strong or a weak adhesive depending on whether the mould gate region is intended to remain on the substrate 100 or not: as was the case in relation to the mould gate regions 300 and 400.

Even though in this example only one mould gate region has been illustrated, there would be none of the redeployment problems that would otherwise be associated with the prior art in having a plurality of such mould gate regions.

The respective mould gate regions 300, 400, and 500 of FIGS. 3, 4 and 5 can comprise, for example, polyimide tape, such as high temperature tape known as Kapton, or aluminium, copper or some other metallic foil or metallic deposition; or a silicone based material; or polytetrafluoroethylene; or any suitable combination of these.

An important point to note is that mould gate tapes that are implemented with metallic foil/deposition or polytetrafluoroethylene must be electrically isolated from the top side metallization layer. This isolation can be achieved for example by, a solder resist layer, or by an insulating tape onto which the foil/deposition is suitably attached.

Figure 6:
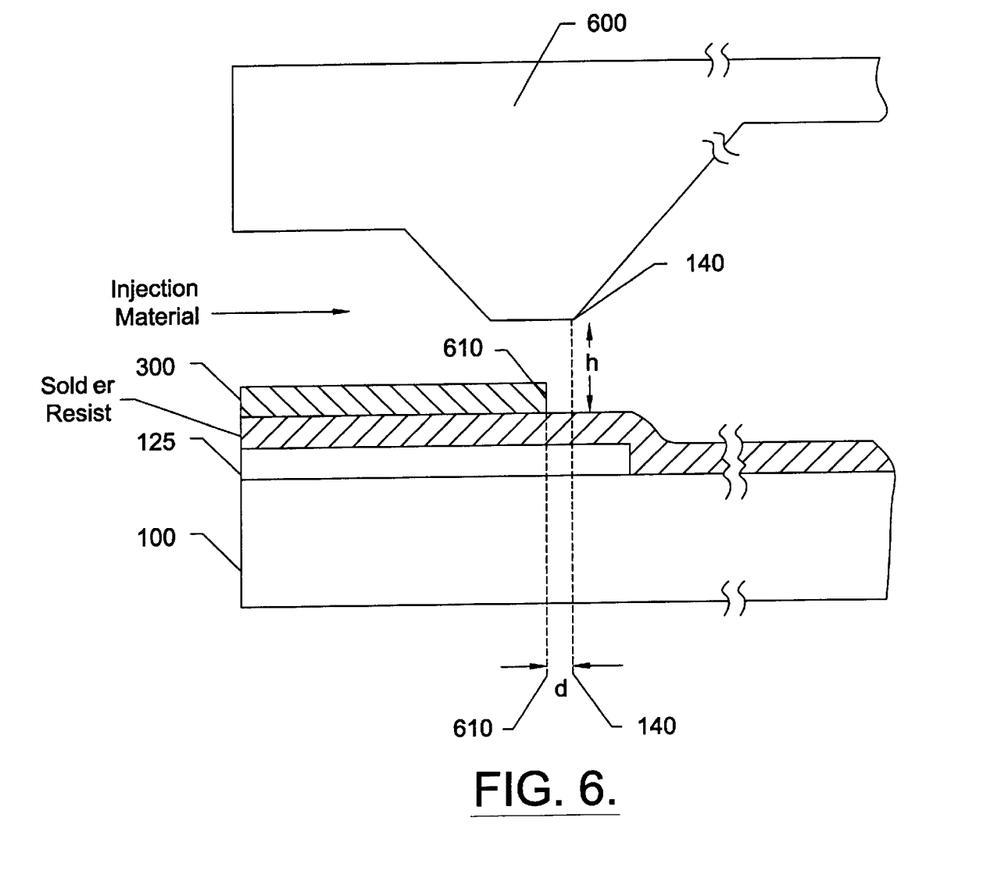
FIG. 6 illustrates a representative cross-sectional view through the center of a mould gate region, cavity mould, substrate, metal region, and an insulating solder resist layer.

FIG. 6 illustrates a representative cross-sectional view along an AA direction in FIG. 3, through the center of a mould gate region 300, of a cavity mould 600, a substrate 100, a metal region 125, and an insulating solder resist layer.

It can be seen in FIG. 6 that in this preferred embodiment, rather than the end portion 610 of the mould gate tape 300 being encapsulated by the material of the encapsulation, this end 610 can be distanced from what will become the periphery 140 of the moulded region by a distance d. The distance d equals one or several tenths of a millimetre. This distancing, coupled with the fact that the plastic is forced through an aperture having a small height h (typically h=0.3 millimetres), produces an intentional weak area in and around the distance d. This intentional weak area is advantageously used to make a substantially clean break when removing the residual, or excess, plastic from the mould gate region after completion of the moulding process.

Figure 7:
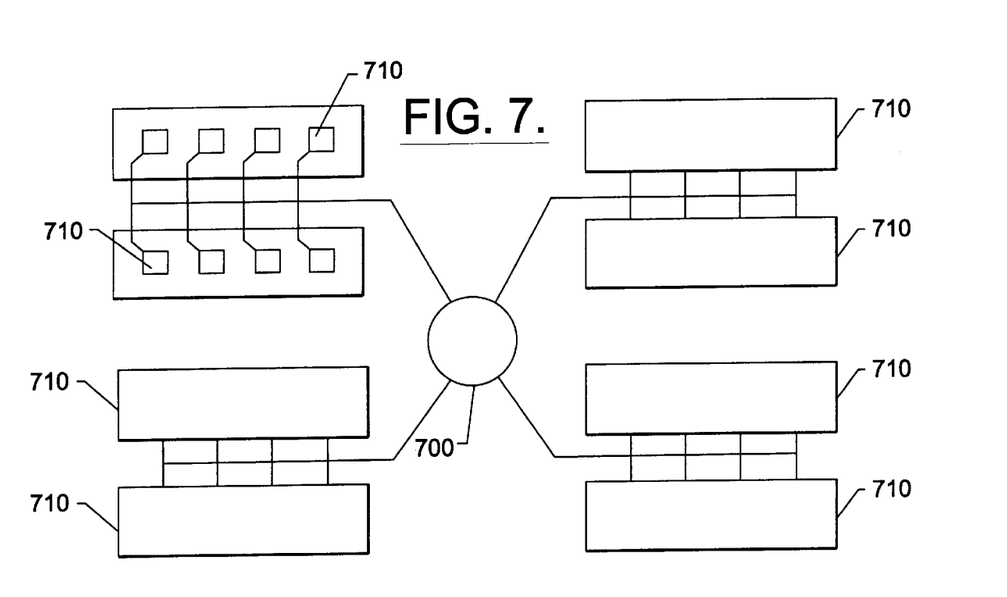
FIG. 7 illustrates a basic arrangement of how solder ball array packages that are without mould gate regions according to the invention.

FIG. 7 illustrates the basic arrangement of how solder ball array packages that are without mould gate regions are conventionally moulded.

The arrangement of FIG. 7 is associated with non-automated moulding processes, wherein, a single source 700 is used to distribute the moulding material to the packages 710 to be moulded. Some disadvantages associated with this non-automated arrangement are that the distribution of the plastic may not be even, which will result in quality related problems, and that the control of the distribution is crucial.

Figure 8A:
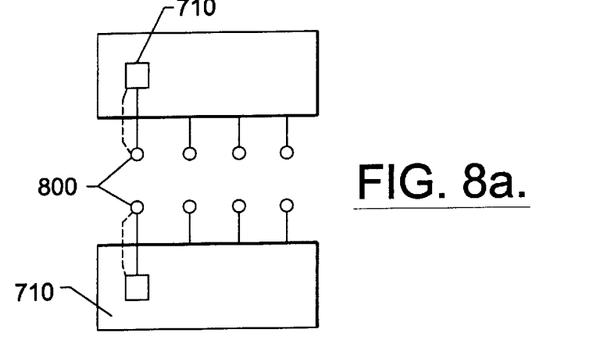
FIGS. 8A, 8B illustrate basic arrangements of how solder ball array packages that have mould gate regions can be moulded in the invention.
Figure 8B:
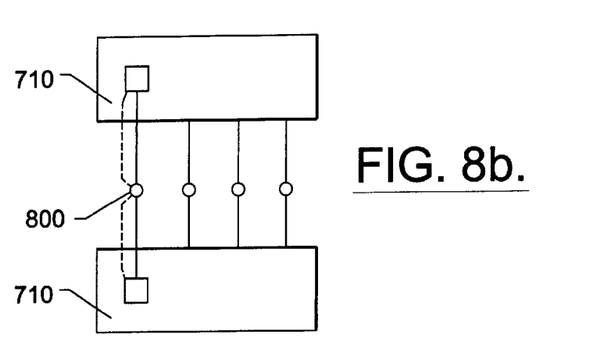

FIGS. 8a and 8b illustrate basic arrangements of how solder ball array packages that have mould gate regions can be moulded.

The arrangement of FIGS. 8a and 8b are associated with an automated moulding process, wherein, several sources 800 are used to distribute the moulding material to, in these illustrated examples, one or two packages, per source 800, to be moulded. These type of arrangement overcome the disadvantages associated with the arrangement illustrated in FIG. 7.

Therefore, in manufacturing terms, the advantage of moulding a solder ball array package via a mould gate tape is that the manufacturing can be fully automated, including the degating of the waste moulding material. A fully automated manufacturing process leads to lower costs, higher productivity and more process control.

What is claimed is:

1. A solder ball array package combination comprising:

a circuit carrying insulating substrate having opposing planar first and second sides and corners;

a first metallization pattern, attached to the first side of the circuit carrying insulating substrate, that includes a plurality of bond pads, a plurality of via pads, and a plurality of electrical connections between the plurality of bond pads and the plurality of via pads;

a second metallization pattern, attached to the second side of the substrate;

a plurality of electrically conductive vias that penetrate through the substrate for making electrical connections between the plurality of via pads and the metallization pattern on the second side of the substrate;

a semiconductor device mounted on the first side of the substrate;

a protective plastic cover formed from an encapsulation material and moulded about the semiconductor device and a substantial portion of the first side of the substrate, wherein the protective plastic cover includes an outer periphery and is formed to reveal a second portion of the first side of the substrate about the perimeter of the protective plastic cover; and a substantially straight mould gate region overlying said second portion of the first side of the substrate at a corner through which encapsulation material had been received to form the protective plastic cover, wherein said mould gate region further comprises a straight interface and a mould gate tape attached by adhesive over at least a part of the first metallization pattern, said mould gate tape including an end that is spaced within the outer periphery of the protective plastic cover such that the end is covered by the protective plastic cover and extends straight without curvature portions from the end and along the circuit carrying substrate and such that it forms a weak area at the mould gate region that had enhanced the clean breaking of the encapsulation material.

2. A package according to claim 1, wherein said tape comprises one of a metallic foil or deposition or polytetrafluoroethylene.

3. A package according to claim 1, wherein the substrate is substantially rectangular configured having corners, wherein said tape is situated at one of said corners of said substrate.

4. A package according to claim 1, wherein the substrate is substantially rectangular configured having corners, and wherein the tape is positioned between two corners of the substrate.

5. A solder ball array package combination comprising:

a circuit carrying insulating substrate having opposing planar first and second sides and corners;

a metallization pattern, attached to the first side of the circuit carrying insulating substrate, that includes a plurality of bond pads, a plurality of via pads, and a plurality of electrical connections between the plurality of bond pads and the plurality of via pads;

a semiconductor device mounted on the first side of the substrate;

a protective plastic cover formed from an encapsulation material and moulded about the semiconductor device and a substantial portion of the first side of the substrate, wherein the protective plastic cover includes an outer periphery and is formed to reveal a second portion of the first side of the substrate about the perimeter of the protective plastic cover; and a substantially straight mould gate region overlying said second portion of the first side of the substrate at the corner through which encapsulation material had been received to form the protective plastic cover, wherein said mould gate region further comprises a straight interface and a mould gate tape attached by adhesive over at least a part of the first metallization pattern, said mould gate tape including an end that is spaced within the outer periphery of the protective plastic cover such that the end is covered by the protective plastic cover and extends straight without curvature portions from the end and along the circuit carrying substrate and such that it forms a weak area at the mould gate region that had enhanced clean breaking of the encapsulation material.

6. A package according to claim 5, wherein said tape comprises one of a metallic foil or deposition or polytetrafluoroethylene.

7. A package according to claim 5, wherein the substrate is substantially rectangular configured having corners, wherein said tape is situated at one of said corners of said substrate.

8. A package according to claim 5, wherein the substrate is substantially rectangular configured having corners, and wherein the tape is positioned between two corners of the substrate.

* * * * *